United States Patent
Yeh et al.

(10) Patent No.: US 8,723,067 B2
(45) Date of Patent: May 13, 2014

(54) CAPACITIVE TOUCH CONTROL SENSOR

(75) Inventors: Yu-Chou Yeh, Taoyuan County (TW); Jui-Ming Ni, Taoyuan County (TW); Ping-Hsu Lai, Taoyuan County (TW); Tzung-Hsien Chen, Taoyuan County (TW)

(73) Assignee: J Touch Corporation, Taoyuan County (TW)

( * ) Notice: Subject to any disclaimer, the term of this patent is extended or adjusted under 35 U.S.C. 154(b) by 33 days.

(21) Appl. No.: 13/560,425

(22) Filed: Jul. 27, 2012

(65) Prior Publication Data

US 2014/0027261 A1   Jan. 30, 2014

(51) Int. Cl.
*H03K 17/975* (2006.01)

(52) U.S. Cl.
USPC .......................................................... 200/600

(58) Field of Classification Search
USPC ............ 200/600, 46, 5 R, 5 A, 292, 511–512
See application file for complete search history.

(56) References Cited

U.S. PATENT DOCUMENTS

| | | | |
|---|---|---|---|
| 6,529,122 B1* | 3/2003 | Magnussen et al. | 340/407.2 |
| 2011/0290631 A1* | 12/2011 | Kuriki | 200/600 |
| 2013/0076542 A1* | 3/2013 | Tanaka et al. | 341/22 |

* cited by examiner

*Primary Examiner* — Edwin A. Leon
(74) *Attorney, Agent, or Firm* — Li & Cai Intellectual Property (USA) Office

(57) ABSTRACT

A capacitive touch control sensor includes a plurality of first electrodes, a plurality of first electrode wires, a plurality of second electrodes, a plurality of second electrode wires. The first and second electrodes are disposed at predetermined interval. The first electrodes have two opposite sensor units and a connecting unit which bridges there-between. Each of the first electrode wires connects one of the first electrodes. Each of the second electrode wires connects more than one of the second electrodes in a same column. The first and second electrodes are arranged alternatively and the neighboring second electrodes are disposed respectively at either side of the connecting unit of the first electrodes.

8 Claims, 2 Drawing Sheets

CAPACITIVE TOUCH CONTROL SENSOR

BACKGROUND

1. Technical Field

The present disclosure relates to a capacitive touch control sensor; in particular, to a single-layered structure.

2. Description of Related Art

FIG. 1 shows an overhead schematic view of a conventional capacitive touch control sensor 1 having a multilayered structure that requires multiple fabrication processes. In a first fabrication process, a plurality rows of first axial electrode blocks 10, a plurality rows of first axial wires 11, and a plurality of rows of separately and adjacently arranged second axial electrode blocks 12 are disposed on a substrate surface of the capacitive touch control sensor 1. The first axial wire 11 interconnects each row of the first axial electrode blocks 10 along a first axial direction, and the second axial electrode blocks 12 are separately interposed between each two adjacent rows of the first axial electrode blocks 10 on either side of the first axial wire 11, respectively. In a subsequent second fabrication process, an insulation layer 15 overlappingly disposed on the interconnecting portion of the first axial wire 11 between each two adjacent first axial electrode blocks 10. Then, in a third fabrication process, a plurality of metallic second axial wires 13 are overlappingly disposed on the insulation layers 15 to interconnect each column of the second axial electrode blocks 12 along a second axial direction. The insulation layer 15 sandwiched between the first axial wire 11 and the second axial wire 13 provides electrical insulation that keeps the first and the second axial wires from shorting, thus constituting a touch control circuit pattern. As can be seen, the fabrication of the conventional multilayer capacitive touch control sensor 1 is complex and the production cost is high. Furthermore, the first electrode wires 14 and the second electrode wires 16 respectively interconnecting the first and second axial electrode blocks 10, 12 are made of visibly non-transparent metal materials which occupy part of the touch control region, resulting in a smaller display area.

SUMMARY

The present disclosure provides a capacitive touch control sensor having electrode arrangement that is compact and requires lower production cost. In addition, the arrangement of the first and second electrode wires allows relatively larger touch screen.

According to one exemplary embodiment of the present disclosure, a capacitive touch control sensor comprises a plurality of first electrodes disposed at predetermined interval, a plurality of first electrode wires, each of which connects to one of the first electrodes, a plurality of second electrodes disposed at predetermined interval and a plurality of second electrode wires, each of which connects to more than one of the second electrodes. Each of the first electrodes has two opposite sensor units and a connecting unit which bridges those sensor units. The first and second electrodes are arranged alternatively and the neighboring two second electrodes are at either side of the connecting unit of the first electrode.

The instant disclosure is a single-layered capacitive touch control sensor and the first and second electrodes together with the first and second electrode wires can be disposed in a single production without the complex multiple procedure. Hence the capacitive touch control sensor has lower fabrication cost and lighter volume.

The material of the first and second electrode and the first and second electrode wires is a transparent conductive material which does not occupy additional region and therefore the touch screen of the related electronic products will be relatively larger.

In order to further understand the present disclosure, the following embodiments are provided along with illustrations to facilitate the appreciation of the present disclosure; however, the appended drawings are merely provided for reference and illustration, without any intention to be used for limiting present disclosure.

DETAILED DESCRIPTION OF THE PREFERRED EMBODIMENTS

The aforementioned illustrations and following detailed descriptions are exemplary for the purpose of further explaining the scope of the present disclosure. Other objectives and advantages related to the present disclosure will be illustrated in the subsequent descriptions and appended drawings.

Figure 1:
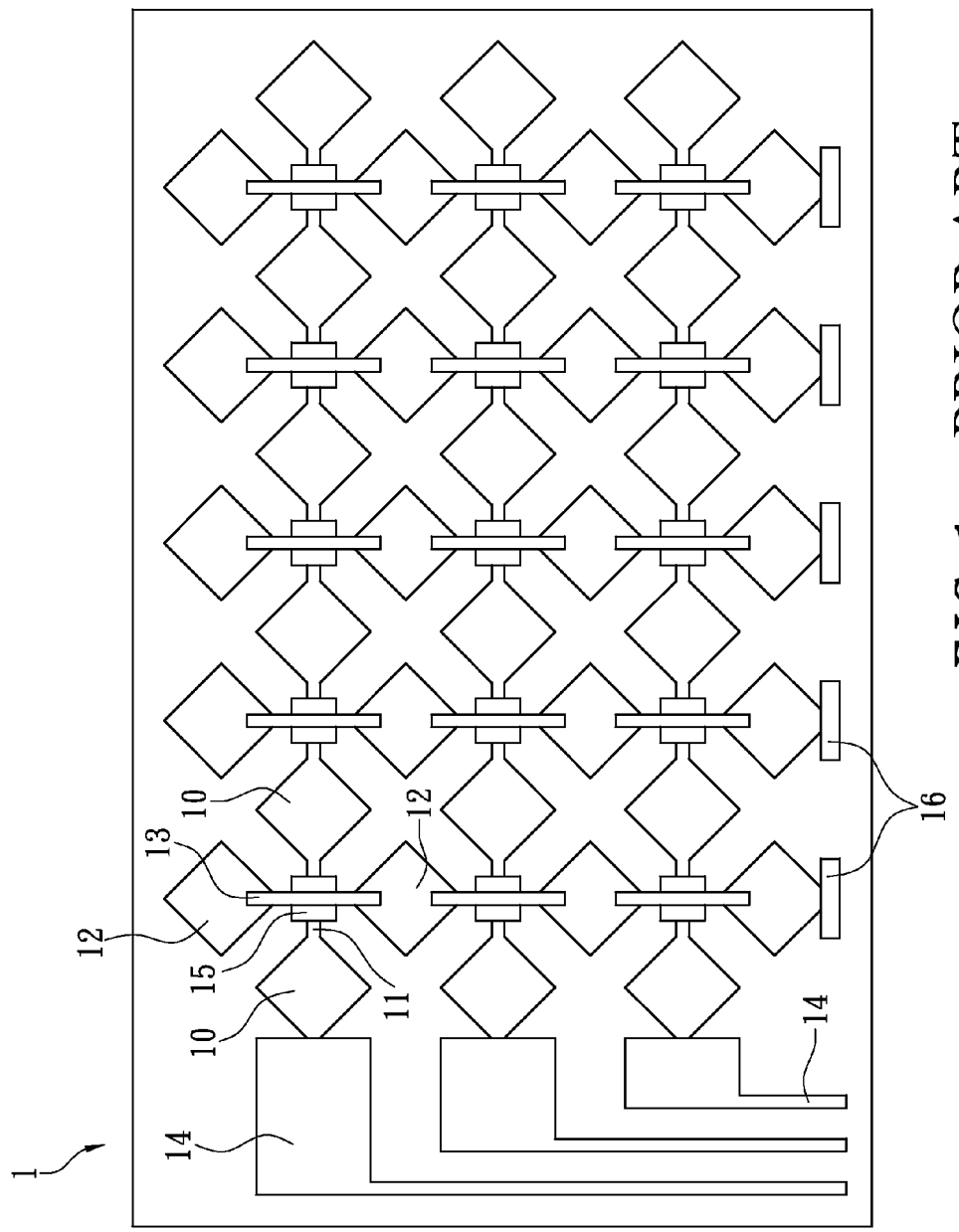
FIG. 1 is a schematic diagram of a known capacitive touch control sensor.
Figure 2:
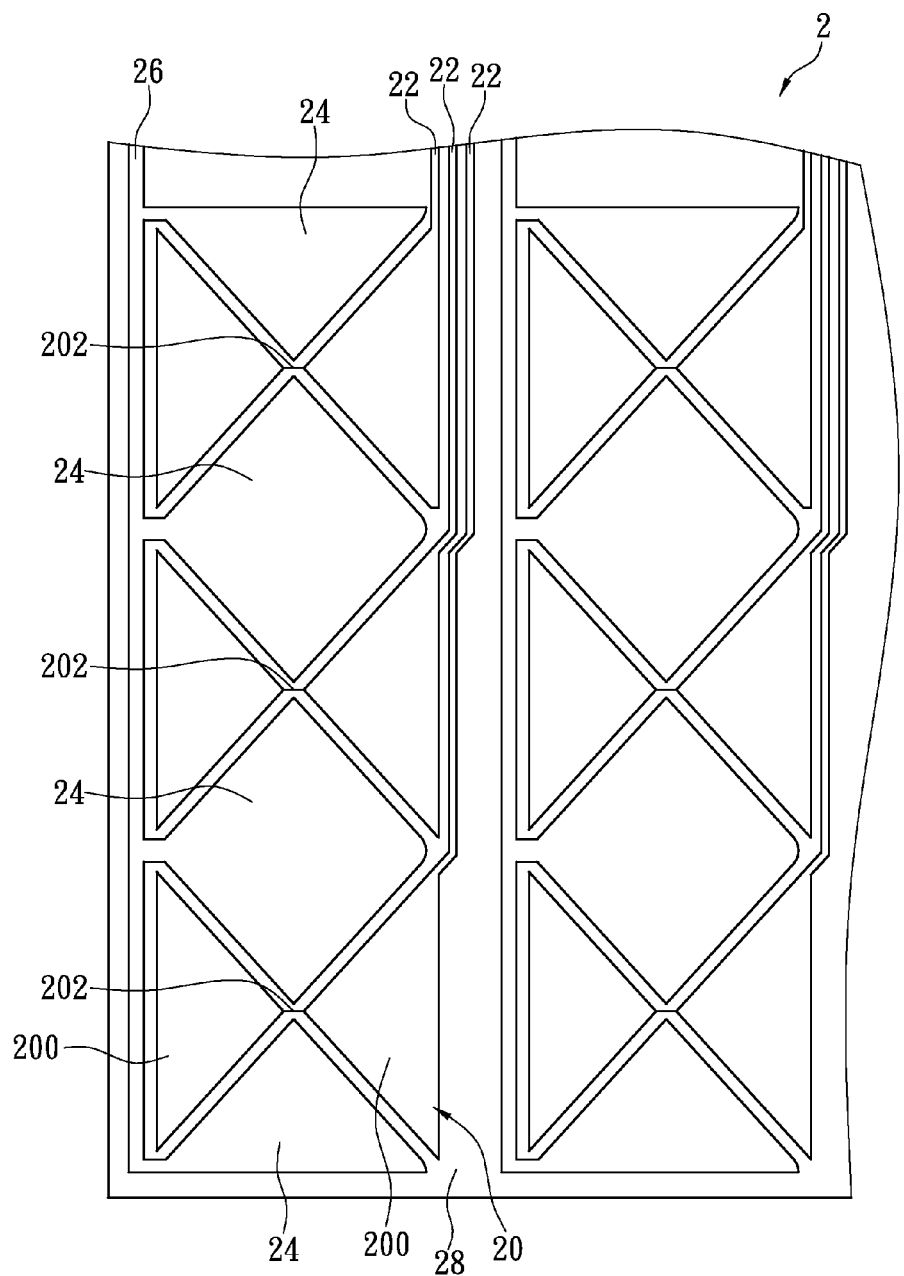
FIG. 2 is a partial schematic diagram of an embodiment of the present disclosure, capacitive touch control sensor.

FIG. 2 shows an embodiment of a capacitive touch control sensor. The capacitive touch control sensor 2 includes a plurality of first electrodes 20, a plurality of first electrode wires 22, a plurality of second electrodes 24 and a plurality of second electrode wires 26. In the instant embodiment, the first and second electrodes 20, 24 and the first and second electrode wires 22, 26 are made of a transparent conductive material selected from a group consisting of: indium tin oxide (ITO), indium zinc oxide, aluminum doped zinc oxide, nanosilver, nanocopper, conductive polymer, carbon nanotube, graphene, silver bromide (AgBr), indium gallium zinc oxide (IGZO) and the combination thereof. The above material can also be used to make the sensor units 200 and the connecting unit 202. For the connecting unit 202, very thin metal wire can be used so the connecting unit 202 will be invisible by the naked eye.

The capacitive touch control sensor can further comprise a transparent substrate 28 and thus the first and second electrodes 20, 24 and the first and second electrode wires 22, 26 can be disposed on the transparent substrate 28. The transparent substrate 28 is made of a material selected from a group consisting of: glass, polycarbonate (PC), polyester (PET), poly (methyl methacrylate) (PMMA), cyclic olefin copolymer (COC) and the combination thereof.

Referring to FIG. 2, the plurality of first electrodes 20 is aligned at predetermined interval. The first electrodes 20 have two opposite sensor units 200 and a connecting unit 202, which bridges the two sensor units 200. In this embodiment, the preferable shape of the sensor units 200 is triangle and the present disclosure is not limited thereto. Also, each of the first electrode wires 22 connects to one of the first electrodes 20.

The plurality of second electrodes 24 is aligned at predetermined interval. In this embodiment, the preferable shape of the second electrodes 24 is triangle or diamond. Nevertheless, the shape of the second electrodes 24 adopted for the capacitive touch control sensor 2 is not limited to the example provided by the instant embodiment.

In addition, the first electrodes 20 and the second electrodes 24 are disposed alternatively and the two neighboring second electrodes 24 are arranged at either side of the connecting unit 202 of the first electrodes 20 respectively.

In summary, the capacitive touch control sensor 2 has a single-layered structure and the first and second electrodes 20, 24 and the first and second electrode wires 22, 26 can all be disposed in a single fabrication without the complicated multiple procedure. Therefore the instant disclosure provides lighter volume products and lower production cost.

Another advantage of the present disclosure arises from the material. The first and second electrodes 20, 24 and the first and second electrode wires 22, 26 are made of transparent conductive material which does not require addition area and thus provides relatively larger touch screen.

The descriptions illustrated supra set forth simply the preferred embodiments of the present disclosure; however, the characteristics of the present disclosure are by no means restricted thereto. All changes, alternations, or modifications conveniently considered by those skilled in the art are deemed to be encompassed within the scope of the present disclosure delineated by the following claims

What is claimed is:

1. A capacitive touch control sensor comprising:
   a plurality of first electrodes arranged at predetermined interval, each first electrode including a pair of opposite sensor units and a connecting unit bridging there-between;
   a plurality of first electrode wires, wherein each of which connects one of the first electrodes;
   a plurality of second electrodes arranged in a plurality of columns at predetermined intervals; and
   a plurality of second electrode wires, wherein each of which connects more than one of the second electrodes in a same column;
   wherein the first and second electrodes are arranged alternatively, and each of the second electrodes are respectively disposed at either side of the connecting unit of the first electrodes.

2. The capacitive touch control sensor according to claim 1, wherein the sensor units of the first electrodes are in a triangular shape.

3. The capacitive touch control sensor according to claim 1, wherein the second electrodes are in a triangular shape.

4. The capacitive touch control sensor according to claim 1, wherein the second electrodes are in a diamond shape.

5. The capacitive touch control sensor according to claim 1, wherein the first and second electrodes and the first and second electrode wires are made of a transparent conductive material.

6. The capacitive touch control sensor according to claim 5, wherein the transparent conductive material is selected from a group consisting of: indium tin oxide (ITO), indium zinc oxide, aluminum doped zinc oxide, nanosilver, nanocopper, conductive polymer, carbon nanotube, graphene, silver bromide (AgBr), indium gallium zinc oxide (IGZO) and the combination thereof.

7. The capacitive touch control sensor according to claim 1, wherein the connecting unit of the first electrodes is a metallic wire.

8. The capacitive touch control sensor according to claim 1, further comprising a transparent substrate where the first and second electrodes and the first and second electrode wires are arranged on the transparent substrate.

* * * * *